United States Patent [19]
Park

[11] Patent Number: 5,978,279
[45] Date of Patent: Nov. 2, 1999

[54] HIGH SPEED TWO-PORT SRAM WITH WRITE-THROUGH FUNCTION

[75] Inventor: Yeon-Jun Park, Cheongju, Rep. of Korea

[73] Assignee: LG Semicon Co., Ltd., Cheongju, Rep. of Korea

[21] Appl. No.: 09/168,069

[22] Filed: Oct. 8, 1998

[30] Foreign Application Priority Data

Dec. 27, 1997 [KR] Rep. of Korea ............... 97/75450

[51] Int. Cl.$^6$ ................................................ G11C 16/04
[52] U.S. Cl. ........................ 365/189.04; 365/230.05; 365/154; 365/156; 365/189.01; 365/205; 365/207
[58] Field of Search .................. 365/189.04, 230.05, 365/154, 156, 189.01, 205, 207

[56] References Cited

U.S. PATENT DOCUMENTS

| | | | |
|---|---|---|---|
| 5,001,671 | 3/1991 | Koo et al. | 365/230.05 |
| 5,062,081 | 10/1991 | Runaldue | 365/230.05 |
| 5,463,585 | 10/1995 | Sanada | 365/201 |
| 5,473,574 | 12/1995 | Clemen et al. | 365/230.05 |
| 5,479,374 | 12/1995 | Kobayashi et al. | 365/233.5 |

*Primary Examiner*—David Nelms
*Assistant Examiner*—Connie C. Yoha
*Attorney, Agent, or Firm*—Fleshner & Kiim

[57] ABSTRACT

A high speed two-port Static Random Access Memory (SRAM) circuit with a write-through function includes a write-through unit receiving data signals DATA, DATAB outputted from a memory cell, carrying out a write-through operation, and outputting first to third signals S1, S2, S3, a data equalizer for equalizing the data signal DATA and the data bar signal DATAB in accordance with an externally generated data line equalizing signal DLEQ, a sense amplifier sensing the data signal DATA and the data bar signal DATAB and amplifying the sensed signals, a switching unit pre-amplifying the data signal DATA and the data bar signal DATAB received via the sense amplifier in accordance with an externally generated read enable signal RE and the first and second signals S1, S2 outputted from the write-through unit, and an output selection unit selecting the third signal S3 from the write-through unit or an output signal of the sense amplifier, in accordance with the first signal S1 outputted from the write-through unit. The circuit intensifies a data amplifying capacity by use of the sense amplifier in a normal operation mode, and when in a write-through operation mode, the sense amplifier is turned off to output the memory cell data and enable the write-through function, thereby obtaining a faster read access time.

11 Claims, 3 Drawing Sheets

FIG. 1
CONVENTIONAL ART
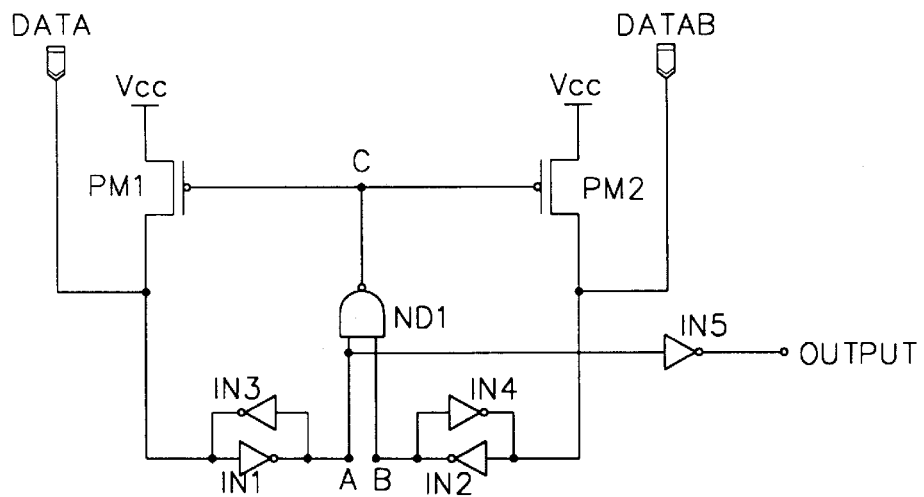
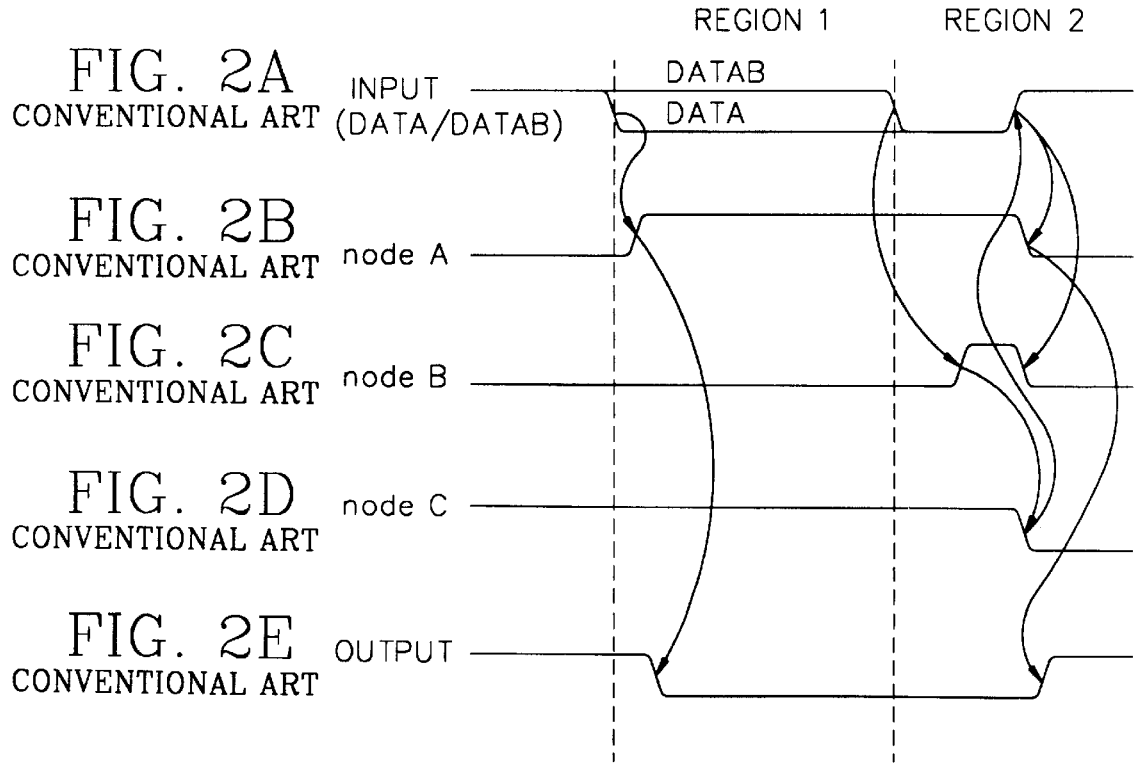
FIG. 2A CONVENTIONAL ART INPUT (DATA/DATAB)
FIG. 2B CONVENTIONAL ART node A
FIG. 2C CONVENTIONAL ART node B
FIG. 2D CONVENTIONAL ART node C
FIG. 2E CONVENTIONAL ART OUTPUT

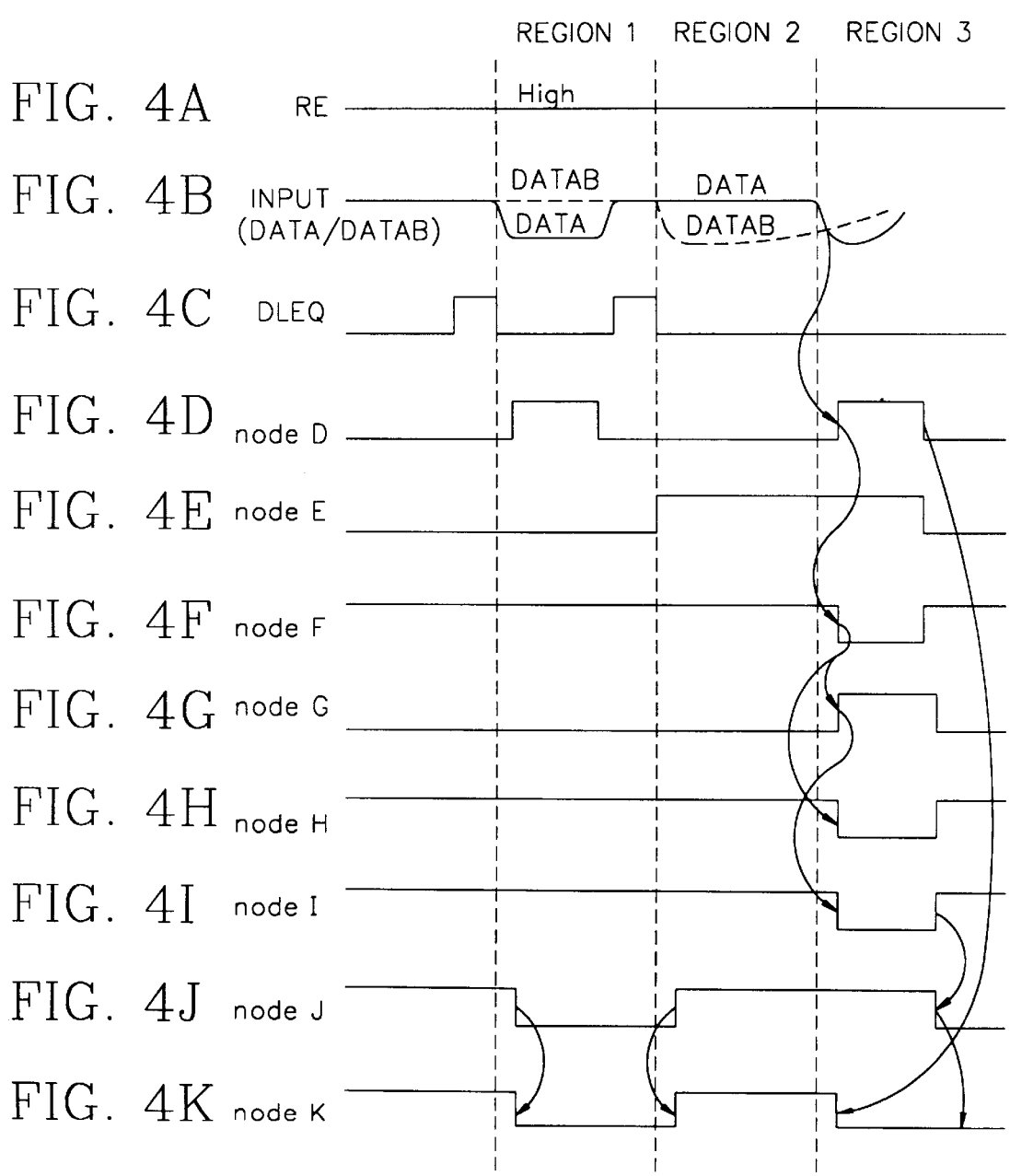

HIGH SPEED TWO-PORT SRAM WITH WRITE-THROUGH FUNCTION

BACKGROUND OF THE INVENTION

1. Field of the Invention

The present invention relates to a two-port SRAM (Static Random Access Memory), and more particularly, to an improved high speed two-port SRAM having a write-through function wherein a sense amplifier and a write-through function are combined.

2. Description of the Background Art

As shown in FIG. 1, a conventional two-port SRAM includes: first and second inverters IN1, IN2 respectively inverting a data signal DATA and a data bar signal DATAB outputted from a memory cell (not shown); a third inverter IN3 inverting an output signal of the first inverter IN1 and outputting the thusly inverted signal to an input terminal of the first inverter IN1; a fourth inverter IN4 inverting an output signal of the second inverter IN2 and outputting the thusly inverted signal to an input terminal of the fourth inverter IN4; a NAND gate ND1 NANDing the respective output signals of the first inverter IN1 and the second inverter IN2; a first PMOS transistor PM1 to the gate of which is applied an output signal of the NAND gate ND1, to the source of which is applied supply voltage Vcc, and the drain of which is connected to an input terminal of the first inverter IN1; a second PMOS transistor PM2 a gate of which is connected to that of the first PMOS transistor PM1, to the source of which is applied the supply voltage Vcc, and a drain of which is connected to an input terminal of the second inverter IN2; and a fifth inverter IN5 inverting an output signal of the second inverter IN2 and externally outputting the thusly inverted signal. Here, reference characters A, B, C designate nodes coupled to respective elements.

With reference to FIGS. 1 and 2A–2E, the operation of the thusly constituted conventional two-port SRAM will now be described.

As shown in FIG. 2A with regard to region 1 of FIGS. 2A–2E, when the data signal DATA and data bar signal DATAB outputted from a memory cell (not shown) are at a high level, if the data signal DATA is transited from high to low level, the signal at a first node A in FIG. 2B is transited to a high level in accordance with the output of the first inverter IN1.

At this time, the data bar signal DATAB remains at a high level, so that a second node B is maintained at a low level as shown in FIG. 2C. Accordingly, the signal at the third node C remains at a high level as shown in FIG. 2D in accordance with the output of the NAND gate ND1, so that the first and second PMOS transistors P1, P2 are maintained in an off state, respectively.

The fifth inverter IN5 which receives the signal of the second node B outputs an output signal OUTPUT at a low level.

As shown in FIG. 2A with regard to region 2 of FIGS. 2A–2E, the data signal DATA outputted from the memory cell (not shown) is not converted to a high level because the driving capability of the third inverter IN3 for carrying out a latching function is large. Instead, the data signal DATA inverted by the first inverter IN1 is maintained at a low level. Meanwhile, the data bar signal DATAB applied to the second inverter IN2 is transited to a low level because the driving capability of the memory cell (not shown) is larger than that of the fourth inverter IN4.

As shown in FIG. 2C, the signal at the second node B is transited to a high level in accordance with the output of the second inverter IN2, and the output of the NAND gate ND1 which receives the signal at the second node B and the high level signal at the first node A is transited to a low level. That is, the signal at the third node C in FIG. 2D is transited to a low level.

The first and second MOS transistor P1, P2 are turned on by the low level third node C signal applied to their gates, so that the data signal DATA and the data bar signal applied to the first inverter IN1 and the third inverter IN3 are transited to a high level, respectively. Also, the signal at first node A and the signal at second node B are transited to a low level, respectively, as shown in FIGS. 2B and 2C.

Then, as shown in FIG. 2E, the output signal OUTPUT is outputted at a high level by the fifth inverter IN5.

However, the conventional two-port SRAM allows the data signal DATA outputted from the memory cell (not shown) to be outputted via the first inverter IN1, and experiences an aggravated amplification capability, thereby lowering the speed. Moreover, a sense amplifier does not exist in the read path and the signal is sensed by inverters, so that although a write-through operation is carried out, a read access time becomes significantly delayed. Further, in order to increase the read access time, the memory cell driving capability should be large enough and accordingly the memory cell becomes increased in size.

SUMMARY OF THE INVENTION

Therefore, it is an object of the present invention to provide a high speed two-port SRAM with a write-through function which converts a read access path in accordance with a respectively required function by combining the write-through circuit and the sense amplification circuit, thereby realizing a high read access time.

To achieve the above-described object, there is provided a high speed two-port Static Random Access Memory (SRAM) circuit with a write-through function according to the present invention which includes a write-through unit for receiving data signals DATA, DATAB outputted from a memory cell, carrying out a write-through operation, and outputting first to third signals S1, S2, S3, a data equalizer for equalizing the data signal DATA and the data bar signal DATAB received from the memory cell in accordance with an externally supplied data line equalizing signal DLEQ, a sense amplifier for sensing the data signal DATA and the data bar signal DATAB and amplifying the sensed signals, a switching unit for pre-amplifying the data signal DATA and the data bar signal DATAB received via the sense amplifier from the memory cell in accordance with an externally read enable signal RE and the first and second signals S1, S2 outputted from the write-through unit, for thereby determining whether to enable the sense amplifier, and an output selection unit for selecting the third signal S3 of the write-through unit or an output signal of the sense amplifier, in accordance with the first signal S1 outputted from the write-through unit.

The object and advantages of the present invention will become more readily apparent from the detailed description given hereinafter. However, it should be understood that the detailed description and specific example, while indicating a preferred embodiment of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein:

FIG. 1 is a schematic circuit diagram of a conventional two-port SRAM;

FIGS. 2A through 2E are timing diagrams illustrating respective signals in the circuit of FIG. 1;

FIGS. 4A through 4K are timing diagrams illustrating respective signals in the circuit of FIG. 3.

DETAILED DESCRIPTION OF THE PREFERRED EMBODIMENTS

Figure 3:
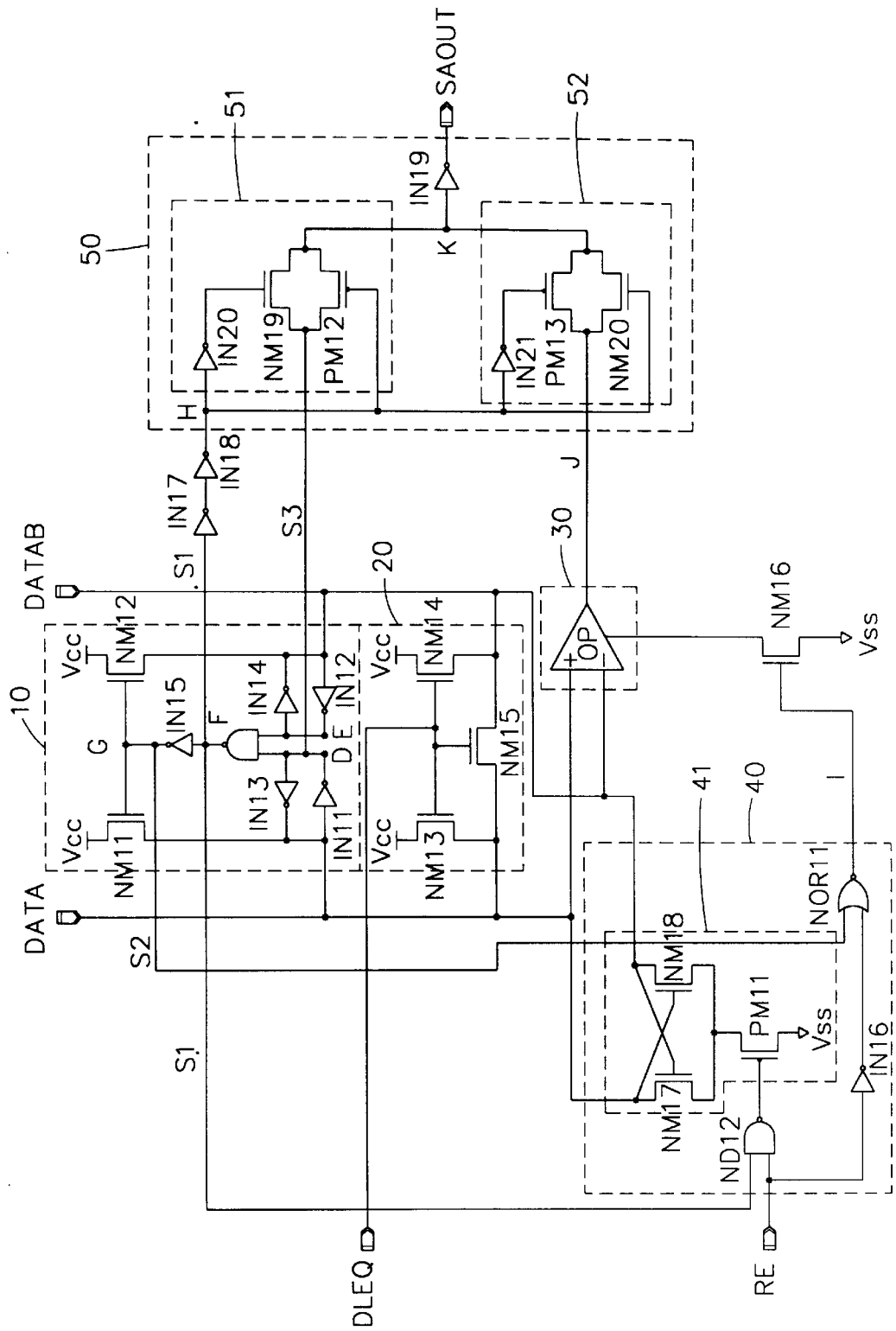
FIG. 3 is a schematic circuit diagram of a high speed two-port SRAM according to the present invention.

With reference to the accompanying drawings, the high speed two-port SRAM with a write-through function according to the present invention will now be described.

As shown in FIG. 3, the high speed two-port SRAM with a write-through function according to the present invention includes: a write-through unit 10 receiving data signals DATA, DATAB outputted from a memory cell (not shown), carrying out a write-through operation, and outputting first to third signals S1, S2, S3; a data equalizer 20 equalizing the data signal DATA line and the data bar signal DATAB line from the memory cell (not shown) in accordance with a data line equalizing signal DLEQ which is externally generated; a sense amplifier 30 sensing the data signal DATA and the data bar signal DATAB which are received from the exterior and amplifying the sensed signals; a switching unit 40 controlling the pre-amplifying of the data signal DATA and the data bar signal DATAB received via the sense amplifier 30 from the memory cell (not shown) in accordance with an externally generated read enable signal RE and the first and second signals S1, S2 outputted from the write-through unit 10, for thereby enabling the sense amplifier 30; and an output selection unit 50 selecting the third signal S3 from the write-through unit 10 or an output signal from the sense amplifier 30, in accordance with the first signal S1 outputted from the write-through unit 10.

The write-through unit 10 includes: first and second inverters IN11, IN12 respectively inverting the data signal DATA and the data bar signal DATAB outputted from the memory cell (not shown); a third inverter IN13 inverting the output signal of the first inverter IN11 and outputting the thusly inverted signal to an input terminal of the first inverter IN11; a fourth inverter IN14 inverting an output signal of the second inverter IN12 and outputting the thusly inverted signal to an input terminal of the second inverter IN12; a first NAND gate ND11 receiving the respective output signals of the first inverter IN11 and the second inverter IN12 and carrying out an NANDing operation thereon; a fifth inverter IN15 inverting the output signal of the first NAND gate ND11; a first NMOS transistor NM11 to the gate of which is applied an output signal of the fifth inverter IN5, the source of which is connected to the supply voltage Vcc, and the drain of which is coupled to the input terminal of the first inverter IN11; and a second NMOS transistor NM12 the gate of which is coupled to that of the first NMOS transistor NM11, the source of which is connected to the supply voltage Vcc, and the drain of which is coupled to the input terminal of the second inverter IN12.

The data equalizer 20 includes: third and fourth NMOS transistors NM13, NM14 the respective sources of which are connected to the supply voltage Vcc; and a fifth NMOS transistor NM15 the source and drain of which are respectively connected to the drains of the third and fourth NMOS transistors NM13 and NM14, and to the data signal DATA line and the data bar signal DATAB line which run from the memory cell (not shown), wherein the data line equalizing signal DLEQ which is externally generated is applied in common to the respective gates of the third to fifth NMOS transistors NM13, NM14, NM15.

The sense amplifier 30 is provided with an operational amplifier OP sensing, amplifying and outputting the difference signal of the data signal DATA and the data bar signal DATAB which are received from the memory cell (not shown) and respectively applied to the non-inverting and inverting inputs thereof, in accordance with an enable signal outputted from the switching unit 40.

The switching unit 40 includes: a second NAND gate ND12 NANDing the first signal S1 outputted from the write-through unit 10 and the read enable signal RE which is externally generated; a pre-amplifying unit 41 pre-amplifying the data signal DATA and the data bar signal DATAB which are received from the memory cell (not shown) and applied to the sense amplifier 30, in accordance with an output signal of the second NAND gate ND12; a sixth inverter IN6 inverting the externally generated read enable signal RE; a NOR gate NOR11 NORing an output signal of the sixth inverter IN6 and the second signal S2 outputted from the write-through unit 10; and a sixth NMOS transistor NM16 to the gate of which is applied an output signal of the NOR gate NOR11, the source of which is connected to ground voltage Vss, and the drain of which is connected to the operational amplifier OP in sense amplifier 30.

The pre-amplifying unit 41 includes: a first PMOS transistor PM11 to the gate of which is applied an output signal of the second NAND gate ND12, and the drain of which is connected to ground voltage Vss; and parallel seventh and eighth NMOS transistors NM17, NM18, the respective sources of which are commonly connected to the drain of the first PMOS transistor PM11, and the respective drains and gates of which are cross-connected to each other, wherein the drain of the seventh NMOS transistor NM17 is connected to the non-inverting input (+) input terminal of the operational amplifier OP in sense amplifier 30 together with the data signal DATA line from the memory cell (not shown), and wherein the drain of the eighth NMOS transistor NM18 is connected to the inverting (−) input terminal of the operational amplifier OP in the sense amplifier 30 together with the data bar signal DATAB line from the memory cell (not shown).

The output selection unit 50 includes: seventh and eighth inverters IN18 connected in series and sequentially delaying the first signal S1 outputted from the write-through unit 10; a first transmission gate 51 for transmitting the third signal S3 outputted from the write-through unit 10 in accordance with the sequentially delayed first signal S1; a second transmission gate 52 transmitting an output signal of the sense amplifier 30 in accordance with the sequentially delayed first signal S1; and a ninth inverter IN19 commonly connected to the outputs of the first and second transmission gates 51, 52 and inverting an output signal of the first transmission gate 51 or the second transmission gate 52, and externally outputting the thusly inverted signal.

The first transmission gate 51 includes a tenth inverter IN20 inverting the first signal S1 outputted from the inverter IN18; a ninth NMOS transistor NM19 to the gate of which is applied an output signal of the tenth inverter IN20, to the source of which is applied the third signal S3 outputted from the write-through unit 10, and the drain of which is connected to an input terminal of the ninth inverter IN19; and a second PMOS transistor PM12 to the gate of which is applied the sequentially delayed first signal S1 outputted from the inverter IN18, and the source of which is connected to the third signal S3 outputted from the write-through unit 10, and to the drain of which is applied an input terminal of the ninth inverter IN19.

The second transmission gate 52 includes: an eleventh inverter IN21 inverting the sequentially delayed first signal S1 outputted from the inverter IN18; a third PMOS transistor PM13, to the gate of which is applied an output signal of the eleventh inverter IN21, to the source of which is applied an output signal of the sense amplifier 30, and the drain of which is connected to the input terminal of the ninth inverter IN19; and a tenth NMOS transistor NM20 to the gate of which is applied the sequentially delayed first signal S1 outputted from the inverter IN18 and, to the source of which is applied the output signal of the sense amplifier 30, and the drain of which is connected to the input terminal of the ninth inverter IN19.

Here, reference characters D through K denote nodes at the interconnections between respective elements.

The operation of the thusly constituted high speed two-port SRAM according to the present invention will now be described with reference to FIGS. 3 and 4A–4K.

With regard to regions 1, 2 in FIGS. 4A–3K illustrating the carrying out of a normal operation, when a high level externally generated data line equalizing signal DLEQ as shown in FIG. 4C is applied, the third to fifth NMOS transistors NM13~NM15 in the data equalizing unit 20 are all turned on thereby, and accordingly as shown in FIG. 4B, the data signal DATA line and the data bar signal DATAB line from the memory cell (not shown) are equalized to a high level (~Vcc), respectively. Also, when a low level data line equalizing signal DLEQ is received, the data signal DATA line and the data bar signal DATAB line are sensed and the sensed signals are amplified by the sense amplifier 30 and then outputted therefrom.

That is, when the level on the data signal DATA line from the memory cell (not shown) transmits from high to low level, and when the level on the data bar signal DATAB line remains at a high level, the first node D and the second node E are set to a high level and a low level, respectively as shown in FIGS. 4D and 4E, by the first and second inverters IN11, IN12 in the write-through unit 10. The third node F is maintained at a high level as shown in FIG. 4F, in accordance with the output of the first NAND gate ND11.

The signal a the third node F signal, that is, the first signal S1 from the write-through unit 10 is sequentially delayed by the inverters IN17, IN18, and then applied at node H to the first transmission gate 51 and the second transmission gate 52. Here, the first transmission gate 51 is turned off by the high level delayed first signal S1 applied to the node H.

Therefore, the signal from the first node D in the write-through unit 10 does not pass through the first transmission gate 51. That is, because the ninth NMOS transistor NM19 and the second PMOS transistor PM12 are turned off by the high level delayed first signal S1, the signal from the first node D (that is, the third signal S3) from the write-through unit 10 is not passed through.

The second transmission gate 52 is turned on by the sequentially delayed high level first signal S1, so that the output signal of the sense amplifier 30 is inverted and externally outputted via the inverter IN19. That is, the third PMOS transistor PM13 and the tenth NMOS transistor NM20 in the second transmission gate 52 are turned on by the high level delayed first signal S1, so that the output signal (at a seventh node J) from the sense amplifier 30 is transmitted to the eighth node K at the input of the inverter IN19. Then, the node J output signal from the sense amplifier 30 is inverted and externally outputted by the inverter IN19.

At this time, the signal at the fourth node G remains at a low level due to the third node F signal being at a high level in the write-through unit 10, so that the first and second NMOS transistors NM11, NM12 are turned off and accordingly the data signal DATA line and the data bar signal DATAB line are not influenced.

Meanwhile, the first NOR gate NOR11 in the switching unit 40 NORs the signal at the fourth node G (the second signal S2 from the write-through unit 10) and the read enable signal RE externally inputted and inverted by the sixth inverter IN16, and outputs the NORed value thereof. At this time, the signal at the fourth node G is at a low level, and the read enable signal RE remains at a high level, so that the output of the first NOR gate NOR11 is set to a high level.

In accordance with the high level output signal from the first NOR gate NOR11, the sixth NMOS transistor NM16 is turned on to connect the control input of the operational amplifier OP in the sense amplifier 30 to Vss, and in accordance with the on state of the sixth NMOS transistor 16, the sense amplifier 30 is enabled to carry out an amplifying operation.

Then, the second NAND gate ND12 in the switching unit 40 NANDs the externally applied read enable signal RE and the signal from the third node F (first signal S1) from the write-through unit 10, and outputs the NANDed value thereof.

At this time, the signal at the third node F is at a high level and the read enable signal RE is at a high level, so that the output signal of the second NAND gate ND12 remains at a low level.

Therefore, the first PMOS transistor PM11 in the pre-amplifying unit 41 is turned on, and the pre-amplifying unit 41 amplifies the data signal DATA and the data bar signal DATAB which are received from the memory cell (not shown) to the sense amplifier 30. With regard to the pre-amplifying operation of the pre-amplifying unit 41, the more the potential difference between the data signal DATA line and the data bar signal DATAB line, the better the sensing operation of the sense amplifier 30 is carried out.

Next, the signal sensed and amplified in the sense amplifier 30 is externally outputted through the second transmission gate 52 and the ninth inverter IN19 of the output selection unit 50. At this time, the output signal of the sense amplifier 30 is outputted at a low level only when the applied data signal DATA and the data bar signal DATAB differ from each other.

Subsequently, when the externally applied data line equalizing signal DLEQ transit from low level to high level, the third to fifth NMOS transistors NM13~NM15 in the data equalizing unit 20 are turned on, so that, as shown in FIG. 4B, the data signal DATA line and the data bar signal DATAB line from the memory cell (not shown) are equalized in a high level. When the data line equalizing signal DLEQ transits from high level to low level, the data signal DATA and the data bar signal DATAB are sensed and amplified by the sense amplifier 30 and the resultant value is outputted accordingly.

At this time, the data signal DATA from the memory cell (not shown) is maintained at a high level with regard to the operation of the sense amplifier 30 and the switching unit 40, and when the data bar signal DATAB is at a low level, there is carried out an operation identical to the above case in which the data signal DATA is at a low level and the data bar signal DATAB is at a high level. Also, the output signal of the sense amplifier 30 is transited from a low level to a high level (seventh node J of FIG. 4J). Accordingly, the eighth node K signal is turned to a high level.

With regard to region 3 (in a write-through operation) of FIGS. 4A through 4K, the data signal DATA from the memory cell (not shown) in FIG. 4B is transited from a high level to a low level without a variation in the data line equalizing signal DLEQ in FIG. 4C.

Therefore, level at the first node D is transited to a high level by the inverter IN11 as shown in FIG. 4D, and the output signal of the third inverter IN13 remains at a high level, wherein the output signal (at the third node F) of the first NAND gate ND11 is transited to a low level as shown in FIG. 4F. At this time, the level at the fifth node H serving as an output control is transited to a low level in accordance with the signal at the third node F, so that the signal from the first node D is transmitted through the first transmission gate 51 to the eighth node K, and then inverted and externally outputted by the ninth inverter IN19.

Also, as the output signal (third node F) of the first NAND gate ND11 is transited to a low level, the output signal (fourth node G) of the fifth inverter IN15 is transited to a high level as shown in FIG. 4G. In accordance with the signal at the fourth node G, the output signal (sixth node J) of the first NOR gate NOR11 is transited to a low level, thereby turning off the sense amplifier 30. In accordance with the output signal (third node F) of the first NAND gate ND11, the output signal of the second NAND gate ND12 is transited to a high level and the first PMOS transistor PM11 of the pre-amplifying unit 41 is turned off, whereby the pre-amplifier (that is, NMOS transistors NM16, NM17) becomes inoperable.

The output signal (fourth node G) of the fifth inverter IN15 is transited to a high level, so that the first and second NMOS transistor NM11, NM12 of the write-through unit 10 are turned on, whereby the data signal DATA and the data bar signal DATAB received from the first and second inverters IN11, IN12 are transited to a high level, respectively.

Therefore, the respective output signals of the first inverter IN11 and the second inverter IN12, that is, the levels at the first node D and the second node E are transited to a low level as shown in FIGS. 4D and 4E, respectively. In accordance with the signals at the first node D and the second node E, the signal at the third node F is transited to a high level, and in accordance with the signal at the level third node F, the signal at the fourth node G is transited to a low level, and thereby the first and second NMOS transistors NM11, NM12 are turned off again. At this time, the high level signal at the third node F is delayed through the sixth and seventh inverters IN16, IN17 as shown in FIG. 4H, and then applied to the first transmission gate 51, and thereby the first transmission gate 51 is turned off.

As the levels at the third node F and the fourth node G are transited to high level and low level, respectively, the pre-amplifier 40 is turned on, and also the level at the sixth node I is transited to a high level as shown in FIG. 4I, and thusly the sense amplifier 30 is turned on. Accordingly, the level of the output signal (seventh node J) of the sense amplifier 30 is transited to a low level as shown in FIG. 4J.

As a result, the present data signal DATA and the data bar signal DATAB are sensed and amplified by the sense amplifier 30 for thereby being transmitted to the second transmission gate 52. Here, the second transmission gate 52 is already turned on by the signal at the fifth node H, so that the output signal of the sense amplifier 30 is transmitted to the ninth inverter IN19 which in turn inverts it and outputs the final output signal SAOUT to the exterior.

At this time, the output signal outputted from the second transmission gate 52 has a value equivalent to the signal at the first node D which was previously outputted, as shown in FIG. 4K, thereby maintaining the identical final output signal SAOUT.

As described above, the high speed two-port SRAM with a write-through function according to the present invention intensifies a data amplifying capacity by use of the sense amplifier in a normal operation, and when in a write-through operation, the sense amplifier is turned off to output a memory cell data and enable the write-through function, thereby obtaining a faster read access time.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A high speed two-port Static Random Access Memory (SRAM) circuit with a write-through function, comprising:
   a write-through unit for receiving data signals DATA, DATAB outputted from a memory cell, carrying out a write-through operation, and outputting first to third signals S1, S2, S3;
   a data equalizer for equalizing the data signal DATA and the data bar signal DATAB received from the memory cell in accordance with an externally supplied data line equalizing signal DLEQ;
   a sense amplifier for sensing the data signal DATA and the data bar signal DATAB and amplifying the sensed signals;
   a switching unit for pre-amplifying the data signal DATA and the data bar signal DATAB from the memory cell in accordance with an externally read enable signal RE and the first and second signals S1, S2 outputted from the write-through unit, for thereby determining whether to enable the sense amplifier; and
   an output selection unit for selecting the third signal S3 of the write-through unit or an output signal of the sense amplifier, in accordance with the first signal S1 outputted from the write-through unit.

2. The circuit of claim 1, wherein the write-through unit comprises:
   first and second inverters (IN11, IN12) for respectively inverting the data signal DATA and the data bar signal DATAB outputted from the memory cell;
   a third inverter IN13 for inverting an output signal of the first inverter (IN11) and outputting the thusly inverted signal to an input terminal of the first inverter (IN11);
   a fourth inverter (IN14) for inverting an output signal of the second inverter (IN12) and outputting the thusly inverted signal to an input terminal of the second inverter (IN12);

a first NAND gate (ND11) for receiving respective output signals of the first inverter (IN11) and the second inverter (IN12) and carrying out a NANDing operation thereon;

a fifth inverter (IN15) for inverting an output signal of the first NAND gate (ND11);

a first NMOS transistor (NM11) to a gate of which is applied an output signal of the fifth inverter (IN15), to a source of which is applied a supply voltage Vcc, and a drain of which is coupled to an input terminal of the first inverter (IN11); and a second NMOS transistor (NM12), a gate of which is coupled to that of the first NMOS transistor (NM11), a source of which is connected to the supply voltage Vcc, and a drain of which is coupled to an input terminal of the second inverter (IN12).

3. The circuit of claim 1, wherein the data equalizer comprises:

third and fourth NMOS transistors (NM13, NM14), respective sources of which are connected to a supply voltage Vcc; and a fifth NMOS transistor (NM15) a source and a drain of which are connected to a corresponding one of the respective drains of the third and fourth NMOS transistors (NM13, NM14), and to a data signal DATA line and a data bar signal DATAB line respectively from the memory cell, wherein the externally supplied data line equalizing signal DLEQ is applied in common to respective gates of the third to fifth NMOS transistors (NM13, NM14, NM15).

4. The circuit of claim 1, wherein the sense amplifier comprises an operational amplifier (OP) for sensing and amplifying the data signal DATA and the data bar signal DATAB which are received from the memory cell in accordance with an enable signal outputted from the switching unit.

5. The circuit of claim 1, wherein the switching unit comprises:

a second NAND gate (ND12) for NANDing the first signal S1 outputted from the write-through unit and an externally supplied read enable signal RE;

a pre-amplifying unit for pre-amplifying the data signal DATA and the data bar signal DATAB which are received from the memory cell and applied to the sense amplifier, in accordance with an output signal of the second NAND gate (ND12);

a sixth inverter (IN16) for inverting the externally supplied read enable signal RE;

a NOR gate (NOR11) for NORing an output signal of the sixth inverter (IN16) and the second signal S2 outputted from the write-through unit; and a sixth NMOS transistor (NM16) to a gate of which is applied an output signal of the NOR gate (NOR11), to a source of which is applied a ground voltage Vss, and to a drain of which is connected the sense amplifier.

6. The circuit of claim 5, wherein the pre-amplifying unit comprises:

a first PMOS transistor (PM11) to a gate of which is applied an output signal of the second NAND gate (ND12), and to a source of which is connected the ground voltage Vss; and seventh and eighth NMOS transistors (NM17, NM18), respective sources of which are commonly connected to a drain of the first PMOS transistor PM11, and respective drains and gates of which are cross-connected to each other, wherein a drain output signal of the seventh NMOS transistor (NM17) is applied to a nun-inverting (+) input terminal of the sense amplifier together with the data signal DATA received from the memory cell, and wherein the drain output signal of the eighth NMOS transistor (NM18) is applied to an inverting (−) input terminal of the sense amplifier together with the data bar signal DATAB received from the memory cell.

7. The circuit of claim 1, wherein the output selection unit comprises:

seventh and eighth inverters (IN17, IN18) for sequentially delaying the first signal S1 outputted from the write-through unit;

a first transmission gate for transmitting the third signal S3 outputted from the write-through unit in accordance with the sequentially delayed first signal S1;

a second transmission gate for transmitting an output signal of the sense amplifier in accordance with the first signal S1; and a ninth inverter (IN19) for inverting an output signal of the first transmission gate or the second transmission gate, and externally outputting the thusly inverted signal.

8. The circuit of claim 7, wherein the first transmission gate comprises:

a tenth inverter (IN20) for inverting the first signal S1 outputted and sequentially delayed from the write-through unit;

a ninth NMOS transistor (NM19) to a gate of which is applied an output signal of the tenth inverter (IN20), to a source of which is applied the delayed third signal S3 outputted from the write-through unit, and a drain of which is connected to an input terminal of the ninth inverter (IN19); and a second PMOS transistor (PM12) to a gate of which is applied the delayed first signal S1 outputted from the write-through unit, to a source of which is applied the third signal S3 outputted from the write-through unit, and to a drain of which is connected to the input terminal of the ninth inverter (IN19).

9. The circuit of claim 7, wherein the second transmission gate comprises:

an eleventh inverter (IN21) for inverting the delayed first signal S1 outputted from the write-through unit; and a third PMOS transistor (PM13), to a gate of which is applied an output signal of the eleventh inverter (IN21), to a source of which is applied an output signal of the sense amplifier, and a drain of which is connected to an input terminal of the ninth inverter (IN19); and a tenth NMOS transistor (NM20) to a gate of which is applied the delayed first signal S1 outputted from the write-through unit, to a source of which is applied the output signal of the sense amplifier, and a drain of which is connected to the input terminal of the ninth inverter (IN19).

10. The circuit of claim 1, wherein a normal operation is carried out in case the data signal DATA outputted from the memory cell is transited in accordance with a variation of the externally supplied data line equalizing signal DLEQ.

11. The circuit of claim 1, wherein the write-through operation is carried out in case the data signal DATA outputted from the memory cell is transited without a variation of the externally supplied data line equalizing signal DLEQ.

* * * * *